United States Patent [19]
Keesen et al.

[11] Patent Number: 4,839,724
[45] Date of Patent: Jun. 13, 1989

[54] PROCESS FOR THE DIGITAL TRANSMISSION OF INFORMATION

[75] Inventors: Heinz-Werner Keesen; Hartmut Peters, both of Hanover, Fed. Rep. of Germany

[73] Assignee: Deutsche AG für Unterhaltungselectronic OHG, Villingen-Schwenningen, Fed. Rep. of Germany

[21] Appl. No.: 125,497

[22] PCT Filed: Feb. 7, 1987

[86] PCT No.: PCT/EP87/00060
§ 371 Date: Oct. 13, 1987
§ 102(e) Date: Oct. 13, 1987

[87] PCT Pub. No.: WO87/05178
PCT Pub. Date: Aug. 27, 1987

[30] Foreign Application Priority Data
Feb. 18, 1986 [DE] Fed. Rep. of Germany ....... 3605032

[51] Int. Cl.⁴ .............................................. H04N 7/12
[52] U.S. Cl. .................... 358/138; 358/135; 382/56; 375/25; 370/83
[58] Field of Search ................ 358/133, 135, 138, 13; 382/56; 375/25, 27, 122; 370/83

[56] References Cited
U.S. PATENT DOCUMENTS

| | | | |
|---|---|---|---|
| 4,292,651 | 9/1981 | Kretz et al. | 358/135 |
| 4,302,775 | 11/1981 | Widergren et al. | 358/136 |
| 4,394,774 | 7/1983 | Widergren et al. | 382/56 |
| 4,541,012 | 9/1985 | Tescher | 358/133 |
| 4,586,182 | 4/1986 | Gallager | 375/25 |
| 4,694,336 | 9/1987 | Keesen et al. | 358/133 |
| 4,706,264 | 11/1981 | Cung | 382/56 |
| 4,707,738 | 11/1987 | Ferre et al. | 358/136 |

OTHER PUBLICATIONS

W. Chen; "Scene Adaptive Coder"; International Conference on Communication; vol. 2, pp. 22.5.1–22.5.6; Jun. 14–18, 1981.

Dukhovich; "A DPCM System Based on a Composite Image Model"; National Telecommunications Conference; Band 2, vol. 4; pp. 36.2.1–36.2.6; Nov. 30–Dec. 4, 1980.

Primary Examiner—James J. Groody
Assistant Examiner—John K. Peng
Attorney, Agent, or Firm—Spencer & Frank

[57] ABSTRACT

A process for the digital transmission of video signals, wherein the signals to be transmitted are coded according to a variable codeword length code, and this code is adapted at time intervals, preferably at regular time intervals, to a statistic of the signals transmitted.

12 Claims, 6 Drawing Sheets

|   | 7 | 0 | 0 | 0 | 6 | 5 | 5 |
|---|---|---|---|---|---|---|---|
| 7 | 4 | 4 | 3 | 3 | 5 | 4 | 4 |
| 6 | 4 | 2 | 2 | 4 | 3 | 3 | 3 |
| 6 | 5 | 1 | 1 | 1 | 0 | 2 | 2 |
| 6 | 3 | 1 | 0 | 0 | 0 | 0 | 0 |
| 5 | 1 | 2 | 0 | 1 | 1 | 1 | 0 |
| 1 | 2 | 2 | 1 | 0 | 0 | 0 | 0 |
| 1 | 3 | 1 | 2 | 0 | 0 | 0 | 0 |

Fig. 3

| VALUES | BINARY CODE | FREQUENCY | HUFFMAN CODE |
|---|---|---|---|
| 0 | 0 0 0 | 1 9 | 0 L |
| 1 | 0 0 1 | 1 2 | L L |
| 2 | 0 1 0 | 8 | 0 0 L |
| 3 | 0 1 1 | 7 | L 0 0 |
| 4 | 1 0 0 | 6 | 0 0 0 0 |
| 5 | 1 0 1 | 5 | 0 0 0 L |
| 6 | 1 1 0 | 4 | L 0 L 0 |
| 7 | 1 1 1 | 3 | L 0 L L |

Fig. 4

→ OL  LOO  LL  OL

→ LOLO  LOLL  LOLO  LOLO

```
┌─────────────────────────────────────────────────┐
│  Transmission of mean value  (7̄)                │
│                                               ╲ │
└─────────────────────────────────────────────────┘
                                                 ╲15

┌─────────────────────────────────────────────────┐
│  Transmission of the number     of the          │
│  distribution coefficients                      │
│                                               ╲ │
└─────────────────────────────────────────────────┘
                                                 ╲16

┌─────────────────────────────────────────────────┐
│  Transmission of the amounts of distribution    │
│  coefficients                                   │
│                                               ╲ │
└─────────────────────────────────────────────────┘
                                                 ╲17

┌─────────────────────────────────────────────────┐
│  Transmission of the signs   for distribution   │
│  coefficients                                   │
│                                               ╲ │
└─────────────────────────────────────────────────┘
                                                 ╲18

┌─────────────────────────────────────────────────┐
│  Transmission of addresses and control characters │─19
│  and sync words                                 │
└─────────────────────────────────────────────────┘
```

Fig. 8

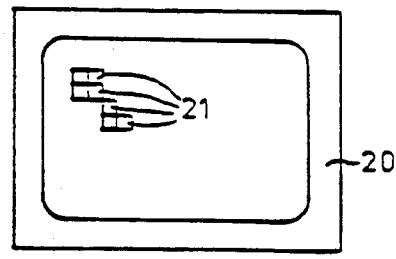

PROCESS FOR THE DIGITAL TRANSMISSION OF INFORMATION

BACKGROUND OF THE INVENTION

The invention is concerned with a process for the digital transmission of information especially for digital video signals obtained fromm analog signals, in which groups of data are processed by a source coder and are sent via a channel coder to a transmission channel and from the transmission channel via a channel decoder to a source decoder.

European Patent Application Publication No. 0,084,270 corresponding to U.S. Ser. No. 336,984 of Apr. 1st, 1982, now U.S. Pat. No. 4,541,012 discloses a process for the encoding of transformed coefficients. A plurality of code tables are used to generate a block of address codes, a DC-coefficient code, and a sequence of codes for transformed coefficients.

SUMMARY OF THE INVENTION

The invention is based on the task to improve transmission processes and/or to optimize the information content of a signal or information, respectively.

The task is solved, in general according to the present invention by encoding the signals from the source coder according to a variable codeword length code, and adapting the variable cordeword length code, at time intervals, according to a statistical value of the signal values actually being processed and transmitted.

BRIEF DESCRIPTION OF THE DRAWINGS

FIG. 3 shows a coefficient block or matrix whose values are to be transmitted;

FIG. 4 is a table showing the relationship between the values of FIG. 3 and a Huffman coding process;

FIG. 8 shows a transmission quantities according to the preferred embodiment of the invention;

FIG. 9 shows a display screen;

DETAILED DESCRIPTION OF THE PREFERRED EMBODIMENTS

Figure 1:
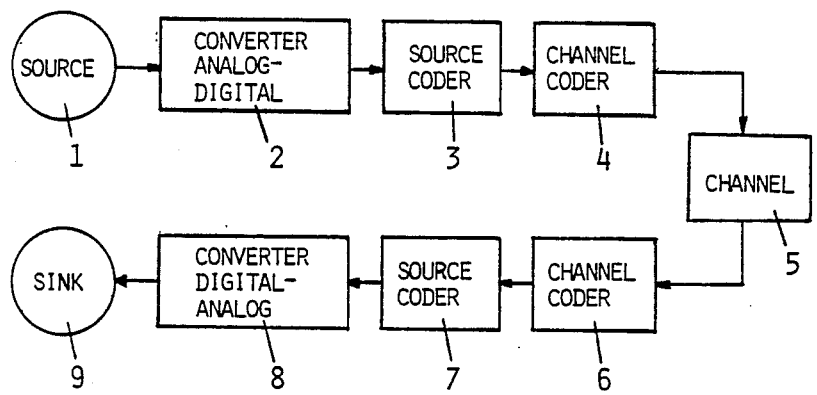
FIG. 1 is a block circuit diagram of a basic known transmission system for use with the method according to the invention.

FIG. 1 shows a transmission system including an information source 1, an ADC 2 (analog-digital converter), a source coder 3, a channel coder 4, a channel 5, a channel decoder 6, a source decoder 7, a DAC 8 (digital-analog converter) and an information sink 9. The channel 5 can, for instance, represent a HF transmission line or a digital videorecorder. A digital videorecorder, line or a digital videorecorder. A digital videorecorder, however, can also represent the ADC 2, the source coder 3, the channel coder 4, the channel 5, the channel decoder 6, the source decoder 7 and the DAC 8. The source 1 is then formed by a HF transmission line, the channel 5 by a magnetic tape and a magnetic head of the videorecorder, and the sink by a television set.

Figure 2:
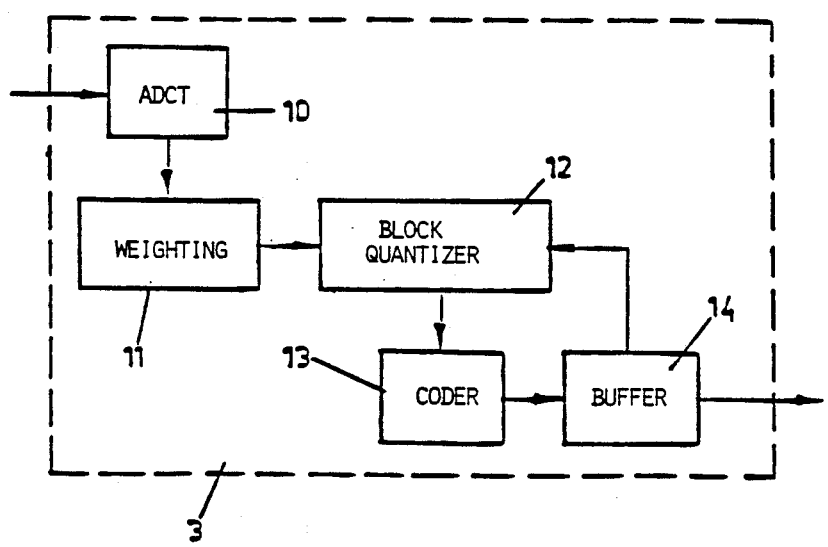
FIG. 2 is a more detailed block diagram of a source coder for use in the circuit of FIG. 1.

FIG. 2 shows that in the source coder 3, a digital signal runs, firstly, through a ADCT 10 (adaptive discrete cosine transformer), secondly, through a weighting member 11, thirdly, through a block quantizer 12, fourthly, through a coder 13 and, fifthly, through a buffer 14. Especially if images are sent to a source coder 3 without intermediate storage, the block quantizer 12 must be controlled so that, at the receiving end, sufficient data for the production of an image with acceptable image quality are always available.

FIG. 3 shows a block of distribution coefficients as it arrives at the block quantizer 12 after an adaptive discrete cosine transformation. The point marked with X contains the distribution coefficient for the steady component of a matrix, called the mean value hereinafter. In practice, a 8 by 8 matrix is used, corresponding to 64 distribution coefficients and 64 pixels, respectively. The 8 by 8 matrix or block contains 64 distribution values or spectral coefficients 0, 1, 2, . . . , 7, called the values hereinafter.

FIG. 4 shows a table for the values 0, 1, 2, . . . , 7. The eight values can be represented in binary code by means of three binary symbols for each value. According to the Huffman coding technique, binary symbols can be saved during a transmission. That is, the frequency of occurrence of the values to be transmitted is determined, and the most frequently transmitted value is supplied with fewer binary symbols than the least frequently transmitted value. The value 0 appears nineteen times in the 8 by 8 block, the value 1 twelve times, the value 2 eight times, and so on. Following the Huffman code, the code 01 is transmitted for the value 0, the code 11 for the value 1, and the code 1011 for the value 7.

Figure 5:
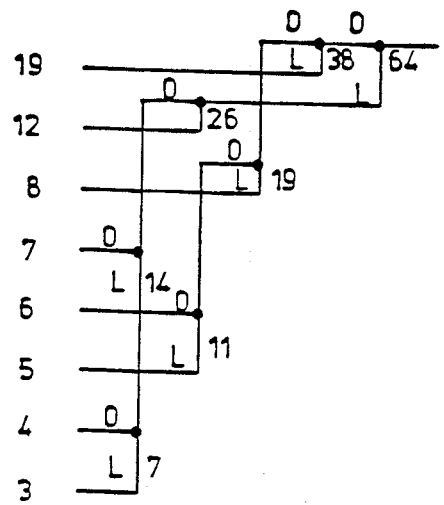
FIG. 5 shows a Huffman coding arrangment.

FIG. 5 shows the calculation scheme according to the Huffman code. Here the frequencies are listed in vertical sequence. The scheme is based on a tree or branching pattern. The lowest frequencies in each case are collected in blocks of two and are added up. Furthermore, sums and/or lowest the frequencies are again added in blocks of two. The collection is done so that the lower values arrive at the sum in a vertical line whereas the higher values do so in a horizontal line. Horizontal lines have the value 0, vertical lines the value 1. The Huffman code is also explained on Pages 52–55 of Robert C. Gallagher, Information Theory and Reliable Communication, copyright 1968 by John Wiley & Sons, Inc. ISBN W-471-29048-3, Library of Congress Catalog Card No. 68-26850.

Figure 6:
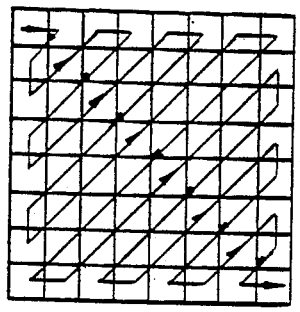
FIG. 6 shows a zigzag scan for the transmission of the coefficients of FIG. 3.

FIG. 6 shows a zigzag scan according to EP-OS No. 0,084,270 European Patent Application No. 0,084,270 and corresponding to U.S. Pat. No. 4,541,012. The scan indicates the sequence of the values to be transmitted.

Figure 7A:
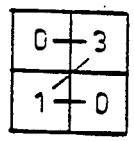
FIGS. 7A and 7B each show a block of coefficients with zigzag-scan sampling and the resulting Huffman code according to the table of FIG. 4.

FIG. 7A shows values 0310, which are to be transmitted according to the Huffman code and the zigzag scan. This results in the binary sequence 011001101.

Figure 7B:
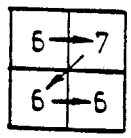

FIG. 7B shows values 6766, which are to be transmitted according to the zigzag scan and the Huffman code. This results in the binary sequence 1010101110101010. The binary sequence for the values 6766 has more binary symbols to be transmitted in comparison with the binary sequence 0310. If the frequency of the values to be transmitted is checked at regular time intervals, the frequency may be different and a new Huffman code may be prepared.

FIG. 8 shows quantities or blocks 15–19, in which the information to be transmitted is listed. Transmitted are the mean value (15), the number of the distribution coefficients (16), the amount of the distribution coefficients (17), the transmission of the signs for distribution coefficients (18), and the addresses, control symbols, and sync words (19). Advantageously, the sequence of the quantities to be transmitted is defined as follows: 19, 15, 16, 17, 18.

FIG. 9 shows a television receiver 20 with time-domain blocks 21 that each contain 64 pixels. The time-domain blocks 21 are transformed, block by block, into the spectral domain. This is done, for instance, by means of the ADCT 10.

Figure 10:
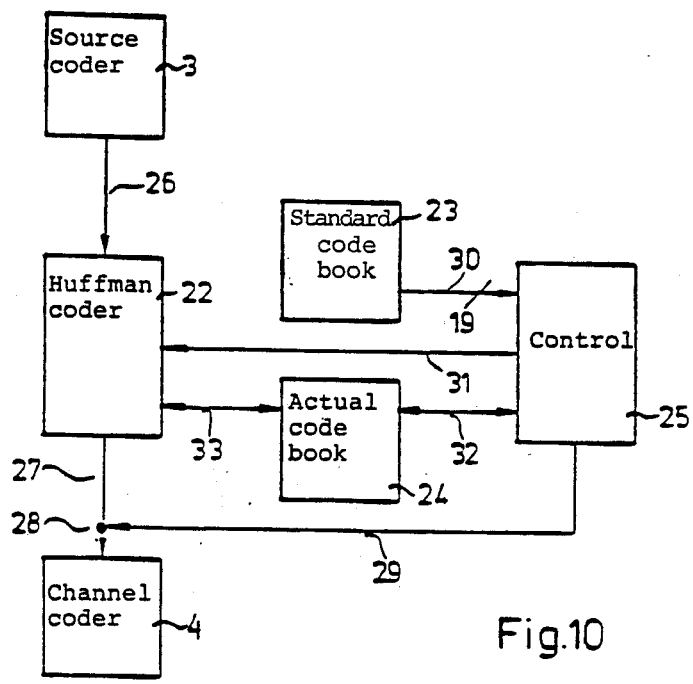
FIG. 10 is a block circuit diagram of an embodiment of a transmitter for use in the method according to the invention.

FIG. 10 shows the reduction of values to be transmitted with an aid of the adaptive Huffman coder according to the preferred embodiment of the invention. For this purpose, a Huffman coder 22 is connected between a source coder 3 and a channel coder 4. In the actual code book 24, the assignments of the values and the Huffman code are stored. If a value appears in the Huffman coder 22, arriving from the source coder 3 via the control line 26, the Huffman code for the value is called up over the control line 33. At the beginning of a transmission, the actual code book 24 is loaded with the contact of a standard code book 23 via the control 25. A line 30 is disposed between standard code book 23 and control 25. A bidirectional line 32 lies between control 25 and actual code book 24. If the actual code book 24 is adapted to the transmitted values, a change occurs between the actual code book and the standard code book 23. The control 25 examines the changes between the actual code book 24 and standard code book 23 and communicates this change to the channel coder 4 via the line 29. For this purpose, the Huffman coder is switched off for this interval via the line 31. Advantageously, a synchronization word, called sync word hereinafter, precedes this communication of change. By means of the channel coder 4, this signal can be recorded on the magnetic tape of a videorecorder, or the signal is transmitted via an HF transmission line. During the switching-on of a sender, the actual code book 24 is loaded with the assignments of the standard code book 23. The control 25 interrogates the standard code book 23 and loads the assignments into the actual code book 24 via the bidirectional line 32. The Huffman coder 2 sends the Huffman-coded values to the channel coder 4 via a line 27 and the nodal point 28. Communications of changes are possible on the basis of a previous actual code book 24 and a new actual code book 44. Advantageously, communications of changes are referenced only to the standard code book 23.

Figure 11:
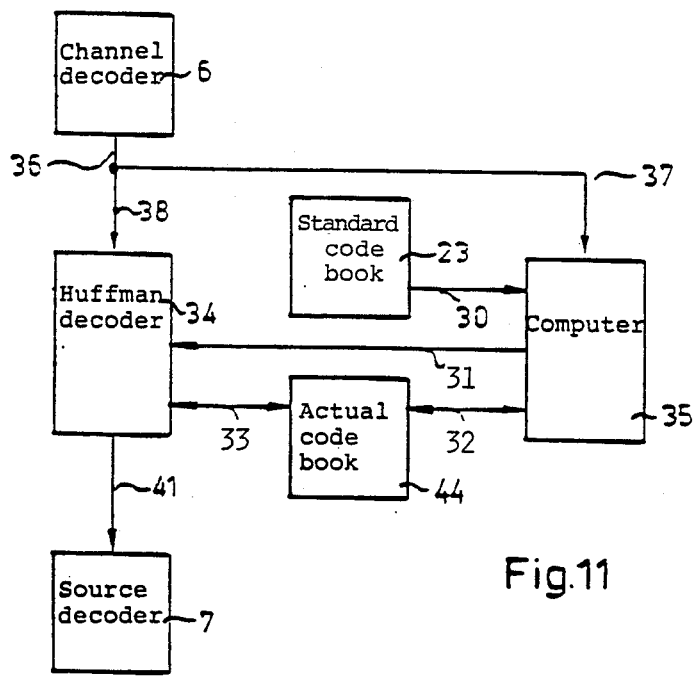
FIG. 11 is a block circuit diagram of an embodiment of a receiver for use in the method according to the invention.

FIG. 11 shows a channel decoder 6, which receives a signal from the magnetic head of a videorecorder or from a HF transmission line. The signals are decoded in the decoder 16 and reach the computer 35 and the Huffman decoder 34 via the lines 36, 37, and 38. During the switching-on of the receiver, the computer 35 loads the actual code book 44 via the bidirectional line 39 with a standard coding regulation from the standard code book 23. The standard coding regulation is defined and is identical for receiver and transmitter. A line 30 lies between standard code book 23 and computer 35. The Huffman decoder 34 interrogates the actual code book 44 via the bidirectional line 33 when signals arrive via the line 38 and assigns the values to the incoming Huffman code. Values are passed on to the source decoder 7 via the line 41. If the computer 35 recognizes control symbols over the line 37, the Huffman decoder 34 is switched off via the line 38 and the actual code book 44 is updated or adapted on the basis of the sync words, control signals, and communications of changes.

Figure 12:
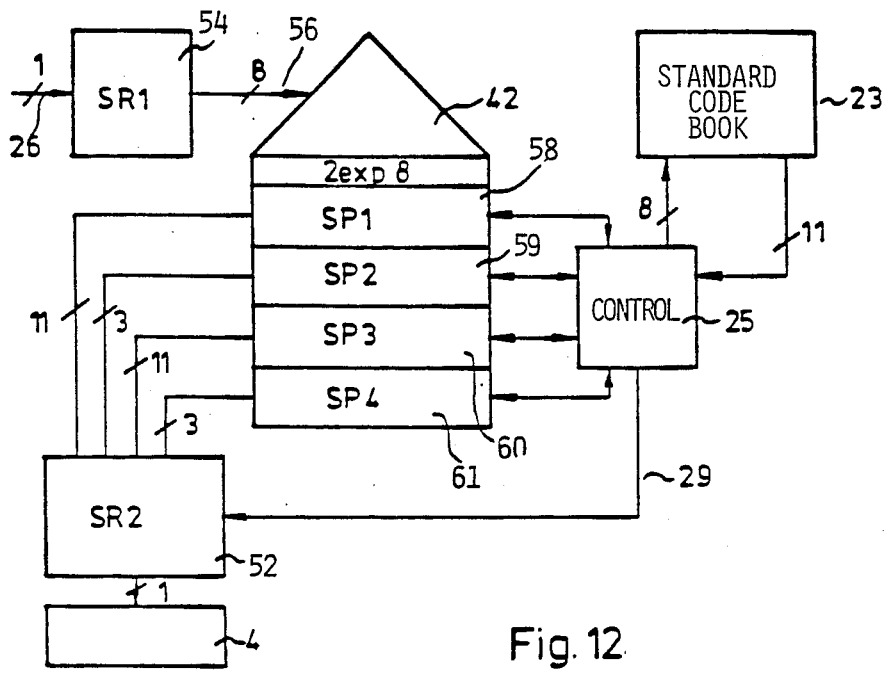
FIG. 12 is a more detailed block circuit diagram of a portion of a transmitter for use with the method according to the invention and particularly a preferred embodiment of the Huffman coder arrangement.

FIG. 12 shows a Huffman coding arrangement according to the invention. A shift register 54 is loaded with values via the line 26. The values have a length of 8 bits. The 8 bits are used as an address and drive an address decoding member 42 by means of an address bus 56. By means of eight addresses, 256 memory locations, that is to say, $2^8$ can be addressed. The Huffman code is in the memory 58. A maximum codeword length of 11 bits can be stored in the memory 58. Via the memory 59, the codeword length can be called up. The codeword length is coded by means of 3-bit line. The memories 60 and 61 correspond to the memories 58 and 59. Two memory units SP1, SP2, (58, 59) and SP3, SP4, (60, 61) are necessary to update the actual code book 24. The memories 58–61 and the address decoding member 42 corresponding to the actual code book 24 of FIG. 10 and may be configured, for instance, by four RAM TMS 4416-15. The standard code book 23 may be configured, for instance, by two EPROM TMS 2516. Eleven assigned values can be recalled via 8 addresses. For this see Texas Instruments, MOS Memory Data Book, 1984—European Edition. In the control 25, the number of values of the same magnitude is counted over a predetermined interval of time. Actualization, i.e., adaptation or updating of the actual code book 24, can be done according to the number of values. If the previous actual code book is in the memories 58, 59, the new actual code book is written into the memories 60 and 61. After an actualization, the actual position is communicated in the shift register 52 via the control line 29 by the control 25. For this purpose, the inputs, at the shift register 52, of the lines between the shift register 52 and the memories 58–61 are blocked. The shift register 52 transmits, during the switch-off, sync words and the actualization, i.e., the new actual code book, to the channel coder 4 for transmission.

It is advantageous firstly, to make an adaptation of the Huffman code in the actual code book 24 on the basis of a threshold-value decision, secondly, to add the number of values over a period of two television images and, after a time period of two television images, undertake an adaptation of the Huffman code, or, thirdly, to make a combination of both adaptations. During a threshold-value decision, the number of values is added up and the adaptation is made after crossing of a predetermined threshold.

Figure 13:
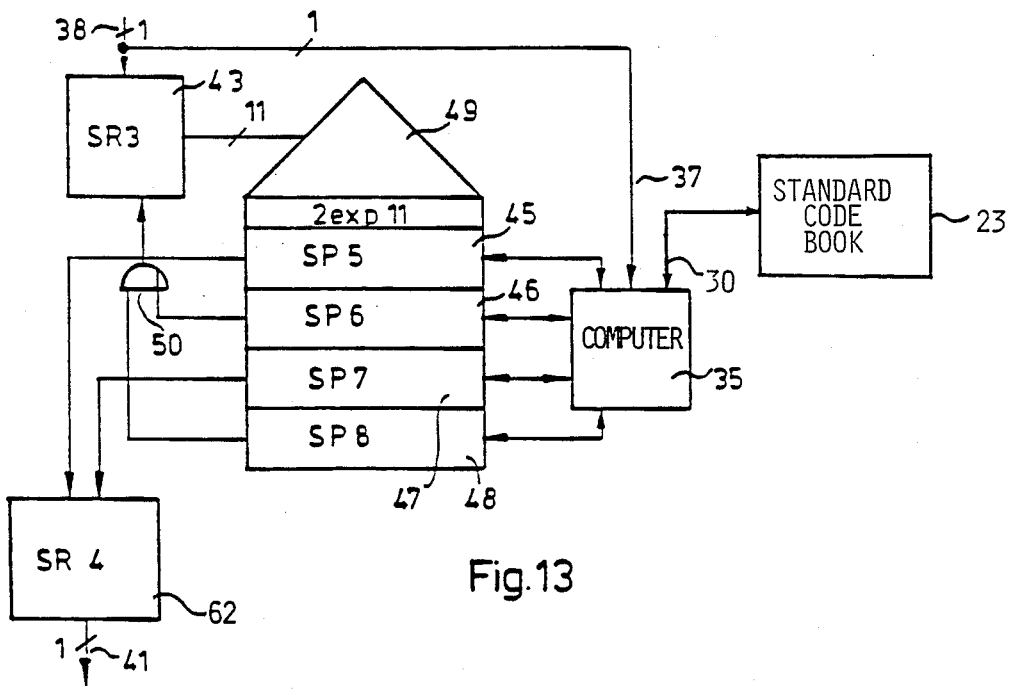
FIG. 13 is a more detailed block circuit diagram of a portion of a receiver for use with the method according to the invention and particularly a preferred embodiment of the Huffman decoder.

FIG. 13 shows a Huffman decoder. The computer 35 recognizes sync words via the line 37 and thus a change of the actual code book. Huffman-coded signals are given to the shift register 43 via the line 38. A length of 11 bits may appear in the shift register 43 after the Huffman coding. The Huffman coding of 11 bits corresponds to an address space of 256 bits, that is to say, $2^8$. The address decoding member 49 has an address space of $2^{11}$, that is to say, 2048 bits. Of these addresses, 256 are for Huffman decoding. The remaining memory locations indicate that no valid Huffman codeword is in the shift register. The memories 45 and 46 correspond to the memories 47 and 48. The shift register 43 is loaded bit by bit. The memories 45–48 and the address decoding member 49 correspond to the actual code book 44 of FIG. 11. All bits are set at zero in the shift register 43. When the Huffman-coded values arrive via the line 38, the bits in the shift register 43 are serially shifted. In each case, upon arrival of a bit, a check is made in the address decoding member 49 whether, according to value in the shift register 43, an address assignment is possible. In this case, 2, 3, 4, . . . or 11 bits could have arrived in the shift register 43. If a Huffman coding is recognized, the assigned value is transmitted from the memory 45 to the shift register 62. At the same time, the shift register 43 is set back to the original state, i.e., all bit points are loaded with zero, by the memory 46 via the OR member 50.

We claim:

1. In a method of transmitting digital data, including processing digital data as groups of values in a source coder, encoding the values of the groups in a variable codeword length encoder according to a defined variable codeword length code to provide signals corresponding to the values of the groups, feeding the signals corresponding to the values of the groups to a channel coder and then to a transmission channel, and finally feeding the signals corresponding to the values from the transmission channel through a channel decoder and a variable codeword length decoder to a source decoder, the improvement comprising:
adapting the defined variable codeword length code to a statistical frequency of the occurrence of the values of the groups being transmitted at desired time intervals; and
transmitting at least the changes in the adapted variable codeword length code via the channel coder, the transmission channel and the channel decoder to the variable codeword length encoder.

2. The method defined in claim 1 wherein: each of the variable codeword length encoder and decoder includes a RAM in which the variable codeword length code is stored; and said step of encoding the values includes providing the corresponding addresses in the RAM to provide the signals corresponding to the values.

3. The method defined in claim 1 wherein said step of adapting is carried out at regular time intervals.

4. The method defined in claim 1 wherein said step of adapting includes changing the variable length codeword code corresponding to the values of a group when the statistical frequency of occurrence of the values during a time interval exceeds a given threshold value.

5. The method defined in claim 4 wherein said step of adapting is carried out at regular time intervals.

6. The method defined in claim 1 wherein the prescribed variable codeword length code is a standard code which is provided in both the variable codeword length encoder and decoder.

7. The method defined in claim 1 wherein said step of adapting includes adapting the variable codeword length code based on an absolute probability of appearance of the preceding data in the subsequent data.

8. The method defined in claim 7 wherein said step of adapting includes adapting the variable codeword length code based exclusively on the absolute probability of appearance of the preceding data in the subsequent data.

9. The method defined in claim 1 wherein said step of transmitting at least the changes includes transmitting the changes between the defined variable codeword length and the adapted variable codeword length code.

10. The method defined in claim 1 wherein said step of transmitting at least the changes includes transmitting the changes between two successive adapted variable length codes.

11. The method defined in claim 1 wherein the variable codeword length code is a Huffman code.

12. The method defined in claim 1 wherein the data to be transmitted is a digital video signal.

* * * * *